United States Patent
Tiziani

(10) Patent No.: US 12,040,263 B2
(45) Date of Patent: Jul. 16, 2024

(54) SEMICONDUCTOR DEVICE WITH DIE MOUNTED TO AN INSULATING SUBSTRATE AND CORRESPONDING METHOD OF MANUFACTURING SEMICONDUCTOR DEVICES

(71) Applicant: STMicroelectronics S.r.l., Agrate Brianza (IT)

(72) Inventor: Roberto Tiziani, Nerviano (IT)

(73) Assignee: STMicroelectronics S.r.l., Agrate Brianza (IT)

(*) Notice: Subject to any disclaimer, the term of this patent is extended or adjusted under 35 U.S.C. 154(b) by 234 days.

(21) Appl. No.: 17/487,772

(22) Filed: Sep. 28, 2021

(65) Prior Publication Data

US 2022/0102258 A1 Mar. 31, 2022

(30) Foreign Application Priority Data

Sep. 30, 2020 (IT) .................. 102020000023122

(51) Int. Cl.
*H01L 23/498* (2006.01)
*H01L 23/00* (2006.01)
(Continued)

(52) U.S. Cl.
CPC ........ *H01L 23/49822* (2013.01); *H01L 23/15* (2013.01); *H01L 23/3107* (2013.01);
(Continued)

(58) Field of Classification Search
CPC .............. H01L 23/49822; H01L 23/15; H01L 23/49575; H01L 23/49872; H01L 23/3107;
(Continued)

(56) References Cited

U.S. PATENT DOCUMENTS 6,879,034 B1 * 4/2005 Yang ..................... H01L 21/568
257/E23.024
8,273,602 B2 * 9/2012 Bathan ................ H01L 23/3107
438/109
(Continued)

FOREIGN PATENT DOCUMENTS

| DE | 102013104081 B3 | 5/2014 |
| JP | 20100096191 A | 4/2010 |
| WO | 2019244372 A1 | 12/2019 |

OTHER PUBLICATIONS

IT Search Report and Written Opinion for IT Appl. No. 102020000023122 dated May 28, 2021 (10 pages).

*Primary Examiner* — Alonzo Chambliss
(74) *Attorney, Agent, or Firm* — Crowe & Dunlevy LLC

(57) ABSTRACT

A packaged semiconductor device includes a substrate having a first surface and a second surface opposite the first surface. At least one semiconductor die is mounted at the first surface of the substrate. Electrically-conductive leads are arranged around the substrate, and electrically-conductive formations couple the at least one semiconductor die to selected leads of the electrically-conductive leads. A package molding material is molded onto the at least one semiconductor die, onto the electrically-conductive leads and onto the electrically-conductive formations. The package molding material leaves the second surface of the substrate uncovered by the package molding material. The substrate is formed by a layer of electrically-insulating material.

18 Claims, 4 Drawing Sheets

(51) Int. Cl.
*H01L 23/15* (2006.01)
*H01L 23/31* (2006.01)
*H01L 23/488* (2006.01)
*H01L 23/495* (2006.01)
*H01L 23/522* (2006.01)
*H01L 23/538* (2006.01)

(52) U.S. Cl.
CPC ...... *H01L 23/488* (2013.01); *H01L 23/49541* (2013.01); *H01L 23/49575* (2013.01); *H01L 23/49838* (2013.01); *H01L 23/49872* (2013.01); *H01L 23/522* (2013.01); *H01L 23/5389* (2013.01); *H01L 24/45* (2013.01); *H01L 24/73* (2013.01); *H01L 24/92* (2013.01); *H01L 24/97* (2013.01); *H01L 2224/4824* (2013.01); *H01L 2924/181* (2013.01)

(58) Field of Classification Search
CPC ......... H01L 23/49838; H01L 2924/181; H01L 24/45; H01L 24/46; H01L 24/97; H01L 23/49541; H01L 23/488; H01L 23/522; H01L 23/5389; H01L 24/73; H01L 24/92
See application file for complete search history.

(56) References Cited

U.S. PATENT DOCUMENTS

| | | | |
|---|---|---|---|
| 8,941,220 B2* | 1/2015 | Kim | H01L 23/49531 361/752 |
| 10,074,590 B1* | 9/2018 | Pavier | H01L 23/50 |
| 11,189,592 B2* | 11/2021 | Upendra | H01L 24/41 |
| 2005/0189659 A1* | 9/2005 | Huang | H01L 21/568 257/E23.125 |
| 2009/0102034 A1 | 4/2009 | Pagkaliwangan et al. | |
| 2009/0218666 A1* | 9/2009 | Yang | H01L 23/4334 438/107 |
| 2010/0015759 A1* | 1/2010 | Takano | H01L 21/565 438/126 |
| 2010/0059870 A1* | 3/2010 | Wen | H01L 25/0655 257/E23.051 |
| 2011/0037170 A1* | 2/2011 | Shinohara | H01L 21/565 257/737 |
| 2013/0015569 A1* | 1/2013 | Anderson | H01L 21/6835 257/737 |
| 2017/0141016 A1 | 5/2017 | Fan | |
| 2019/0006260 A1 | 1/2019 | Pavier et al. | |

* cited by examiner

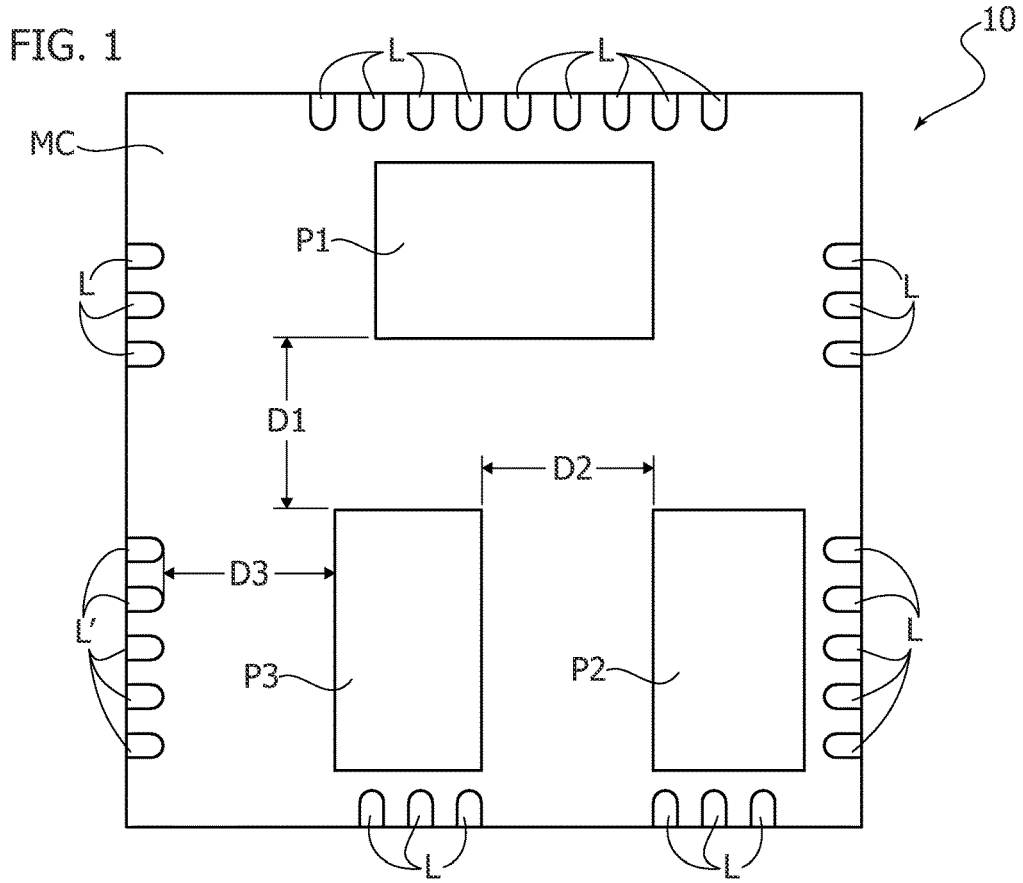

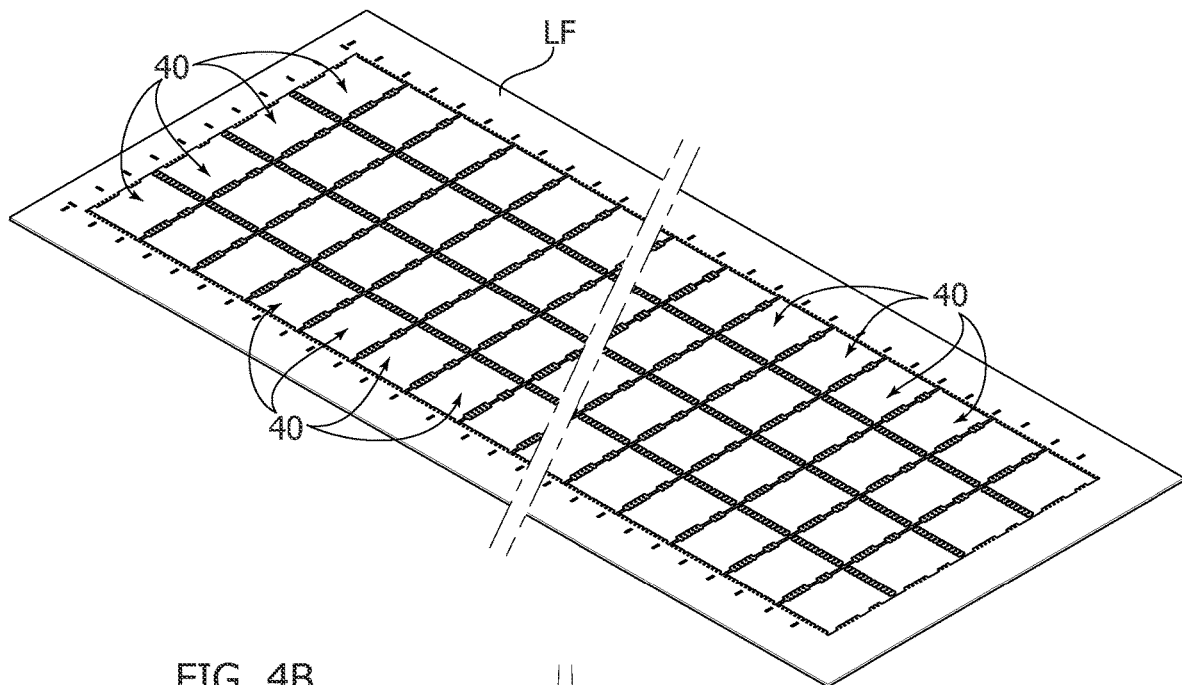
FIG. 4A
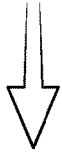
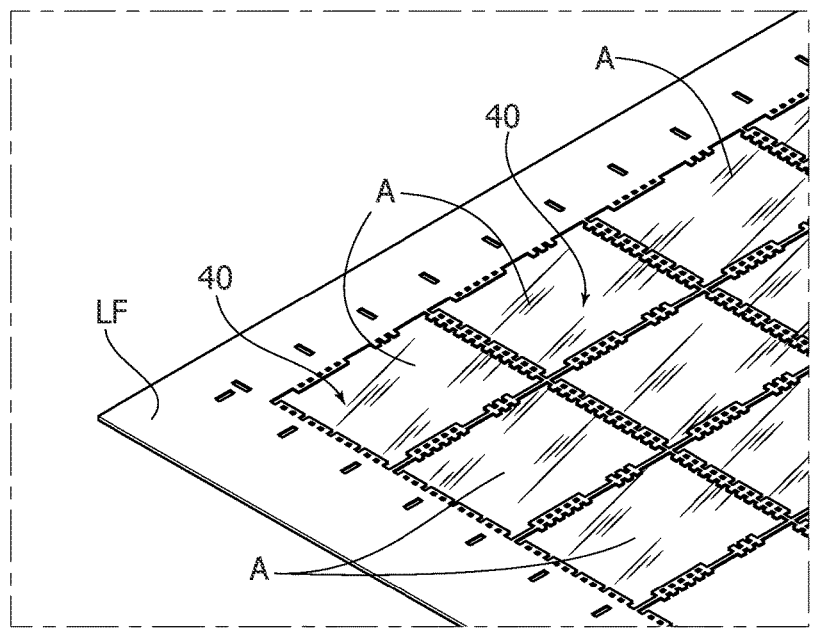
FIG. 4B

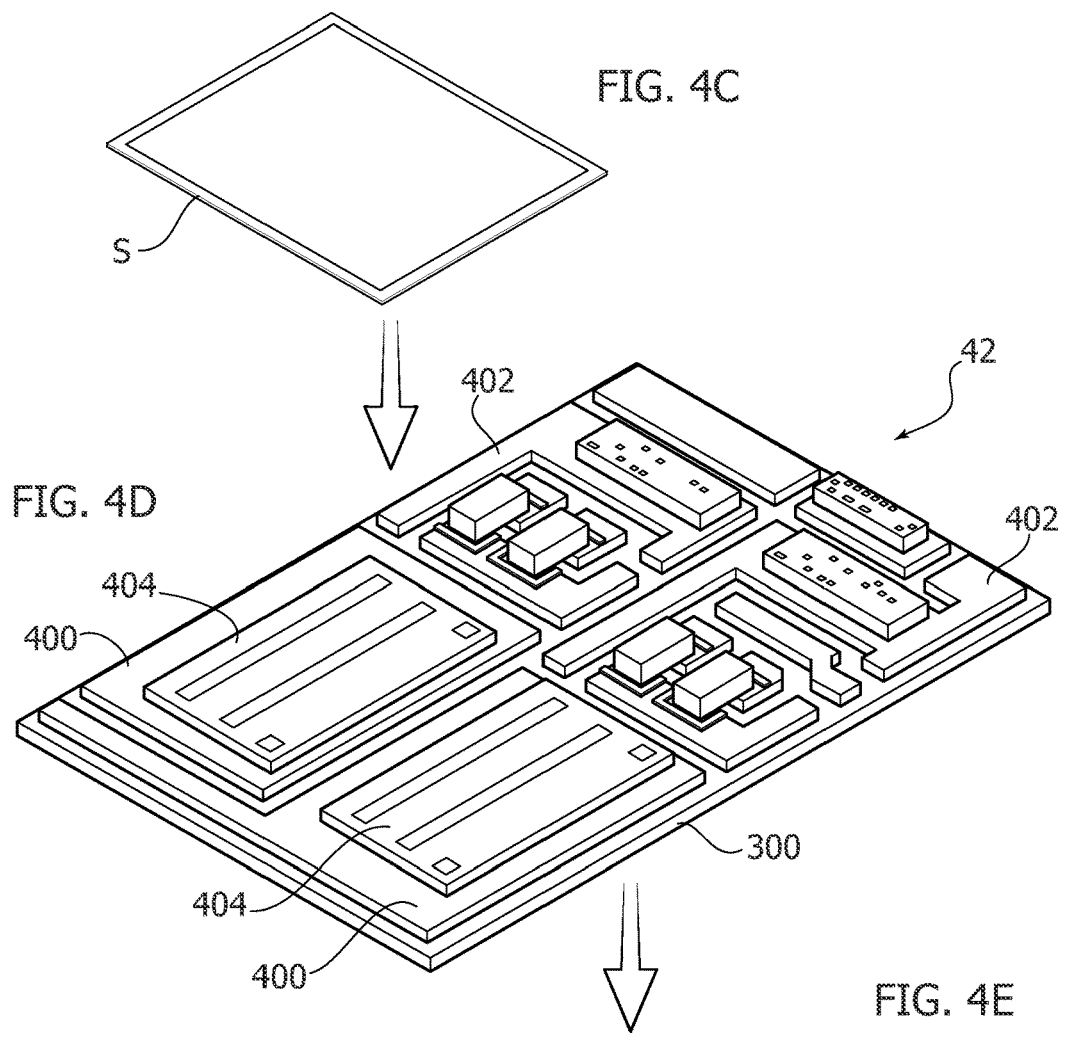
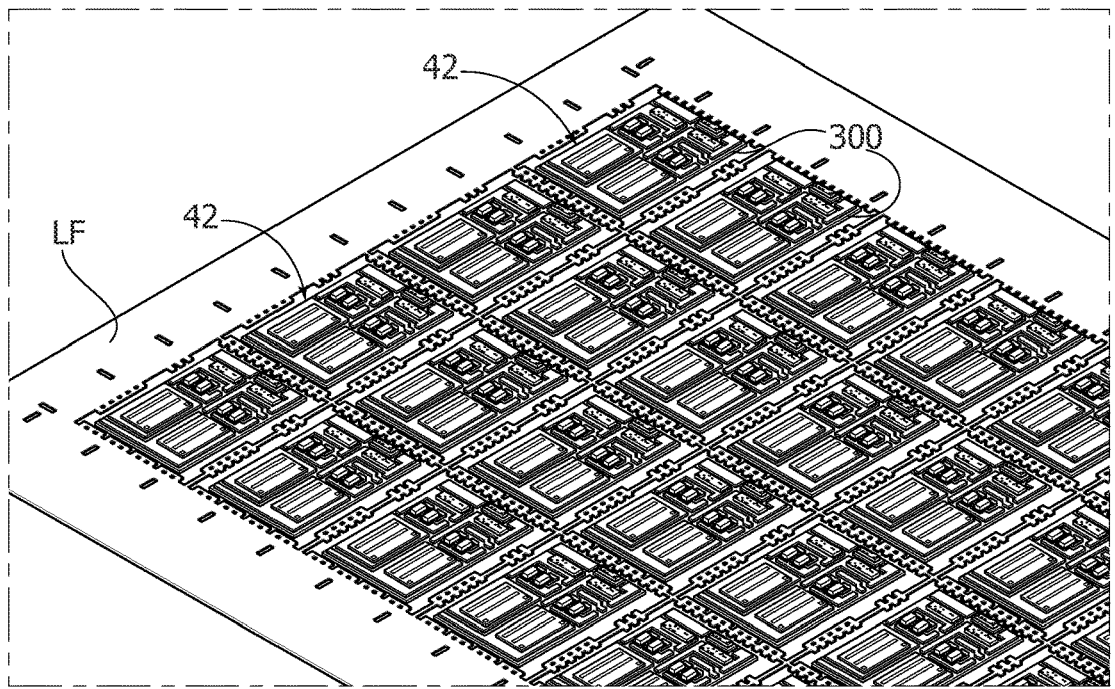

SEMICONDUCTOR DEVICE WITH DIE MOUNTED TO AN INSULATING SUBSTRATE AND CORRESPONDING METHOD OF MANUFACTURING SEMICONDUCTOR DEVICES

PRIORITY CLAIM

This application claims the priority benefit of Italian Application for Patent No. 102020000023122, filed on Sep. 30, 2020, the content of which is hereby incorporated by reference in its entirety to the maximum extent allowable by law.

TECHNICAL FIELD

The description relates to packaged semiconductor devices for high voltage (HV) applications.

In particular, embodiments described herein may relate to packaged semiconductor devices comprising a flat no-leads package, such as a quad-flat no-leads (QFN) package or a dual-flat no-leads (DFN) package.

BACKGROUND

A conventional flat no-leads package for semiconductor devices comprises a metallic leadframe. The designation "leadframe" (or "lead frame") is currently used (see, for instance, the USPC Consolidated Glossary of the United States Patent and Trademark Office) to indicate a metal frame which provides support for one or more integrated circuit chips or dies (e.g., providing so-called "die pads") as well as electrical leads to interconnect the integrated circuit(s) in the chips or dies to other electrical components or contacts (e.g., via a printed circuit board, PCB).

In a flat no-leads package, such a metallic leadframe may thus include one or more die pads, and a plurality of flat leads incorporated into a molding compound (e.g., a resin material such as an epoxy resin). The die pad(s) and the flat leads are exposed at a back (e.g., bottom) side of the package to provide electrical and/or thermal conductivity towards a printed circuit board.

Power converters (e.g., AC-DC or DC-DC power converters) may use a half-bridge topology with MOS field-effect transistors for low voltage applications, and with insulated-gate bipolar transistors (IGBT) or silicon carbide (SiC) transistors or gallium nitride (GaN) transistors for high voltage applications (e.g., involving a voltage higher than 200 V). Power conversion may be implemented in switching mode using the phase wave modulation (PWM) mode.

In modern power converters, a high switching frequency may be desirable in order to increase the efficiency of the converter, but the parasitic impedance between the (gate) driver integrated circuits and the control (gate) terminals of the IGBT/MOSFET may set an upper limit to the switching frequency. Therefore, the overall performance of the converter may benefit from physically placing the gate driver circuits close (e.g., as close as possible) to the IGBT/MOSFET dies in order to reduce the corresponding parasitic inductance. Consequently, a flat no-leads package may be used to package a power converter (e.g., an AC-DC or DC-DC converter) including gate driver circuits (or dies) and MOS/IGBT/SiC/GaN transistor circuits (or dies) in a multi-chip (or multi-die) configuration.

As conventional in the art, the drain or collector terminal of the MOS/SiC/GaN/IGBT transistors may be provided on the silicon backside, so that it may be electrically connected to the respective die pad of the leadframe. Therefore, providing electrical insulation between the high-side transistor and the low-side transistor of the half-bridge may involve positioning the corresponding die pads in the multi-chip package at a (e.g., safe) distance to match certain insulation requirements when the multi-chip semiconductor device is mounted on a printed circuit board, e.g., as regards the clearance distance and/or the creepage distance.

As known in the art, the clearance distance may be defined as the shortest distance between two conductive parts measured through air. Clearance distance helps preventing dielectric breakdown between electrodes caused by the ionization of air.

As known in the art, the creepage distance may be defined as the shortest path between two conductive parts on an insulator measured along the surface of the insulator. A proper and adequate creepage distance may protect against tracking. Tracking is a process that produces a partially conducting path of localized deterioration on the surface of an insulating material as a result of the electric discharges on or close to the insulation surface.

It is noted that, due to the substantial planarity of the back (e.g., bottom) side of a flat no-leads package where the die pads and leads are exposed, the clearance distance and the creepage distance may be substantially the same in a flat no-leads package.

For instance, a power QFN multi-chip half-bridge converter operating at a voltage of 48 V may involve a clearance distance of 0.65 mm (1 mm=$10^{-3}$ m) between the die pads and the ground pad(s) or terminals, and a clearance distance of 1.05 mm between different die pads. Similarly, a power QFN multi-chip half-bridge converter operating at a voltage of 650 V (e.g., for industrial applications) may involve a clearance distance of 2.1 mm between different die pads. A power QFN multi-chip half-bridge converter operating at a voltage of 1200 V (e.g., for industrial applications) may involve a clearance distance of 4 mm between different die pads.

As a result, the size of quad flat no-leads (e.g., QFN) packages for high voltage applications (e.g., high voltage AC-DC or DC-DC converters) may become large, with an associated increased cost, reduced reliability at the board level, and increased parasitic inductance on wires.

Therefore, improved flat no-leads packages for high voltage semiconductor devices may be desirable. There is a need in the art to contribute in providing such improved solutions.

SUMMARY

Embodiments disclosed herein relate to a semiconductor device.

Embodiments disclosed herein relate to a corresponding method of manufacturing semiconductor devices.

According to one or more embodiments, a semiconductor device comprises: a substrate having a first surface and a second surface opposite the first surface; at least one semiconductor die mounted at said first surface of the substrate; a plurality of electrically-conductive leads arranged around said substrate; a plurality of electrically-conductive formations coupling the at least one semiconductor die to selected leads in said plurality of electrically-conductive leads; and package molding material molded onto the at least one semiconductor die mounted at said first surface of the substrate, onto the plurality of electrically-conductive leads and onto the plurality of electrically-conductive formations leaving the second surface of said substrate uncovered by said package molding material. The substrate may comprise a layer of electrically-insulating material.

One or more embodiments may thus not be subject to design requirements regarding creepage and/or clearance of the exposed pads of the packaged semiconductor device, and may result in a smaller and/or less expensive package.

BRIEF DESCRIPTION OF THE DRAWINGS

One or more embodiments will now be described, by way of example only, with reference to the annexed figures, wherein:

FIG. 1 is a plan view exemplary of the back (e.g., bottom) side of a semiconductor device packaged in a QFN package, FIG. 2 is a simplified circuit block diagram exemplary of certain components of a power conversion circuit according to one or more embodiments of the present description, FIGS. 4A to 4E are exemplary of various steps of a method of manufacturing semiconductor devices according to one or more embodiments of the present description.

DETAILED DESCRIPTION

Figure 3:
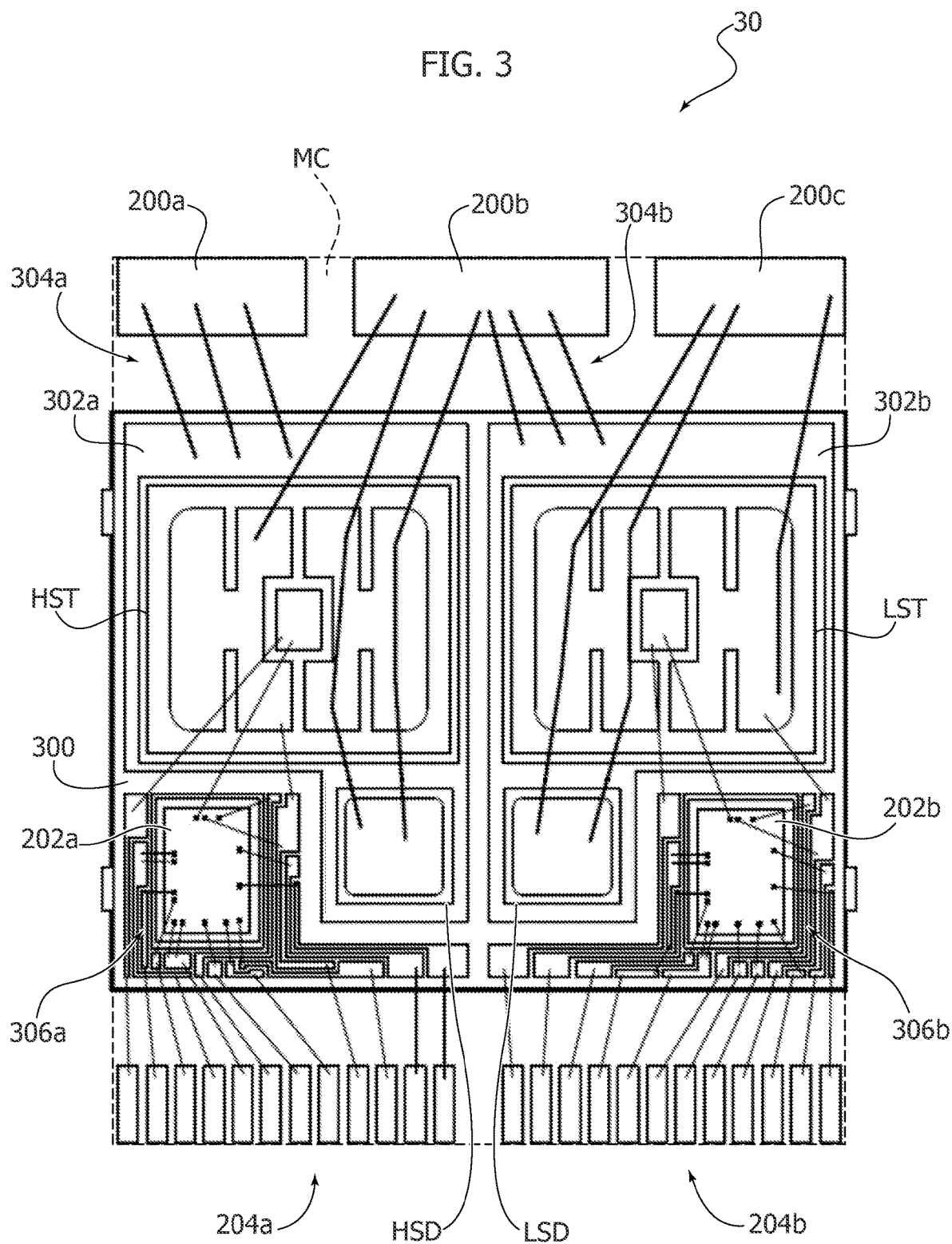
FIG. 3 is a front (e.g., top) view exemplary of certain components of a semiconductor device according to one or more embodiments of the present description.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The headings/references used herein are provided merely for convenience and hence do not define the extent of protection or the scope of the embodiments.

For simplicity, throughout the figures annexed herein, like parts or elements are indicated with like references/numerals. For brevity, a corresponding description will not be repeated for each and every figure.

By way of introduction to the detailed description of exemplary embodiments, reference may first be made to FIG. 1.

FIG. 1 is a plan view exemplary of the back (e.g., bottom) side of a packaged semiconductor device 10 comprising a QFN package. In particular, the semiconductor device 10 may comprise a system-in-package (SiP) for power conversion, the system-in-package including a half-bridge gate driver circuit and high-voltage enhancement mode GaN transistors arranged in a half-bridge configuration.

As exemplified in FIG. 1, the semiconductor device 10 may comprise a squared QFN package, e.g., having dimensions of 9×9 mm. The semiconductor device 10 may comprise a leadframe including a set of die pads P1, P2, P3 and a set of flat leads L, L' encapsulated in a molding compound MC and exposed at the back (e.g., bottom) side of the packaged semiconductor device 10.

Purely by way of example, the die pad P1 may be electrically coupled to a ground or reference voltage terminal of the semiconductor device 10, the die pad P2 may be electrically coupled to the source or emitter terminal of the low-side transistor of the half-bridge (e.g., a half-bridge sense terminal), and the die pad P3 may be electrically coupled to the source or emitter terminal of the high-side transistor of the half-bridge (i.e., the intermediate node of the half-bridge arrangement providing the output voltage of the semiconductor device 10).

Purely by way of example, the flat leads L may provide one or more input and/or output terminals of the semiconductor device 10 (e.g., including both analog and digital input and/or output terminals, such as terminals for a bootstrap supply voltage, a logic supply voltage, a high-side driver logic input, a low-side driver logic input, etc.). Still by way of non-limiting example, the flat leads L' may provide a high voltage supply applied to the drain or collector of the high-side transistor of the half-bridge.

The semiconductor device 10 may operate as a high voltage power converter, that is, a voltage of several hundreds of volts (e.g., 650 V) may be applied to the leads L' coupled to the drain or collector of the high-side transistor of the half-bridge. Therefore, as exemplified in FIG. 1, a creepage distance D1 between the die pad P1 and the die pad P3, a creepage distance D2 between the die pad P2 and the die pad P3, and a creepage distance D3 between the die pad P3 and the leads L' may be subject to certain design requirements, e.g., being equal to or higher than 2.1 mm.

It is noted that the die pads P1, P2, P3 may be electrically coupled (e.g., by means of bonding wires arranged inside the molding compound MC) to certain ones of the leads L, so that electrical connection of the semiconductor device 10 to a printed circuit board may be implemented even in the absence of electrical conductivity through the die pads P1, P2, P3.

Therefore, one or more embodiments of the present description may provide a semiconductor device packaged in a flat no-leads package, wherein the die pads are electrically insulated from the semiconductor dies or chips encapsulated in the molding compound. As a result, the die pads may not be subject to design constraints regarding the compliance with creepage and/or clearance distances.

For instance, FIG. 2 is a simplified circuit block diagram exemplary of certain components of a power conversion circuit 20 to which one or more embodiments may be applied.

As exemplified in FIG. 2, the power conversion circuit 20 may comprise a half-bridge arrangement including a high-side transistor HST and low-side transistor LST, e.g., insulated-gate bipolar transistors (IGBTs). The high-side transistor HST has a current path coupled between a high voltage supply node 200a (e.g., a node configured to receive a high voltage positive supply $V_{POS}$) and an output node 200b (e.g., a node configured to provide a half-bridge output voltage $V_{OUT}$). The low-side transistor LST has a current path coupled between the output node 200b and a half-bridge sense node 200c (e.g., a node configured to receive a high voltage negative or reference supply $V_{NEG}$).

As exemplified in FIG. 2, the power conversion circuit 20 may comprise a high-side diode HSD coupled in parallel to the high-side transistor HST and a low-side diode LSD coupled in parallel to the low-side transistor LST. For instance, the high-side diode HSD may have an anode terminal coupled to the emitter or source terminal of the high-side transistor HST (e.g., at the output node 200b) and a cathode terminal coupled to the collector or drain terminal of the high-side transistor HST (e.g., at the high voltage supply node 200a), and the low-side diode LSD may have an anode terminal coupled to the emitter or source terminal of the low-side transistor LST (e.g., at the half-bridge sense node 200c) and a cathode terminal coupled to the collector or drain terminal of the low-side transistor LST (e.g., at the output node 200b).

As exemplified in FIG. 2, the power conversion circuit 20 may comprise a high-side driver circuit 202a configured to receive one or more high-side input control signals $HS_{in}$ at one or more input nodes 204a and drive accordingly the (gate) control terminal of the high-side transistor HST, and a low-side driver circuit 202b configured to receive one or more low-side input control signals $LS_{in}$ at one or more input nodes 204b and drive accordingly the (gate) control terminal of the low-side transistor LST.

In one or more embodiments, the transistors HSD, LSD, the diodes HSD, LSD and the driver circuits 202a, 202b may be implemented in (physically) separate or distinct semiconductor chips or dies, and may be integrated in a multi-chip semiconductor device as exemplified in FIG. 3, which is a drawing illustrating various components of a semiconductor device 30 (e.g., a power conversion circuit 20) according to one or more embodiments.

Purely by way of example, the semiconductor device 30 illustrated in FIG. 3 may be integrated in a rectangular flat no-leads package having dimensions of 17×20 mm. The semiconductor device 30 may comprise a power conversion circuit 20 operating at a voltage of 1200 V and a current of 40 A at steady state.

In one or more embodiments, the chips or dies (e.g., HST, LST, HSD, LSD, 202a, 202b) of a multi-chip semiconductor device 30 may be provided on an electrically insulating substrate 300.

As exemplified in FIG. 3, a single electrically insulating substrate 300 hosting a plurality of dies may be provided in the semiconductor device 30.

Alternatively, a plurality of electrically insulating substrates may be provided in the semiconductor device 30, e.g., up to providing a respective electrically insulating substrate for each die in the semiconductor device 30.

In one or more embodiments, the electrically insulating substrate(s) may comprise a ceramic substrate. The ceramic material may comprise, for instance, an oxide and/or a nitride material, such as aluminum oxide ($Al_2O_3$) and/or silicon nitride ($Si_3N_4$).

In one or more embodiments, the thickness of the insulating substrate(s) may be in the range of 100 μm to 1.27 mm, e.g., about 0.25 mm.

In one or more embodiments, the conventional metallic die pad(s) of the leadframe of a flat no-leads package may be replaced by the electrically insulating substrate(s) 300, i.e., the metallic leadframe may comprise the leads only (e.g., 200a, 200b, 200c, 204a, 204b).

Alternatively, the leadframe of the flat no-leads package may comprise at least one metallic die pad and the electrically insulating substrate(s) 300 may be attached on the at least one metallic die pad. For instance, the at least one metallic die pad may comprise a single metallic die pad (e.g., a central die pad) or a plurality of metallic die pads, up to a respective metallic die pad for each die in the semiconductor device 30, wherein each of the metallic die pads has a respective electrically insulating substrate attached thereon.

In one or more embodiments as exemplified in FIG. 3, the electrically insulating substrate(s) 300 may have a patterned layer of electrically-conductive material (e.g., copper) provided on a first surface thereof (e.g., an upper or top surface where the semiconductor dies are arranged). Such a patterned layer of electrically-conductive material may comprise (individual) die attachment areas configured to host the semiconductor dies (e.g., HST, LST, HSD, LSD, 202a, 202b), as well as electrically-conductive tracks configured to route electrical signals (e.g., to implement an electrical connection) among different semiconductor dies, and/or between the semiconductor dies and the leads of the leadframe.

For instance, in one or more embodiments a continuous metallic area 302a extending below the high-side transistor HST and the high-side diode HSD may be patterned on the electrically insulating substrate 300, thereby providing a means for electrically coupling the drain or collector of the high-side transistor HST to the cathode of the high-side diode HSD without resorting to the use of bonding wires. Additionally, the continuous metallic area 302a may be electrically coupled to the leads 200a to receive the high voltage positive supply $V_{POS}$ by means of bonding wires 304a.

Similarly, in one or more embodiments a continuous metallic area 302b extending below the low-side transistor LST and the low-side diode LSD may be patterned on the electrically insulating substrate 300, thereby providing a means for electrically coupling the drain or collector of the low-side transistor LST to the cathode of the low-side diode LSD without resorting to the use of bonding wires. Additionally, the continuous metallic area 302b may be electrically coupled to the leads 200b to provide the half-bridge output voltage $V_{OUT}$ by means of bonding wires 304b.

In one or more embodiments, the patterned layer of electrically-conductive material provided on the first (e.g., upper or top) surface of the electrically insulating substrate (s) 300 may comprise one or more tracks for routing one or more signals.

For instance, as exemplified in FIG. 3, a set of tracks 306a may be configured to route signals between the input and/or output leads 204a and the high-side driver circuit 202a. In particular, each of the tracks 306a may comprise a first end bonded to a respective lead 204a (e.g., via a bonding wire), and a second end bonded to a respective bonding pad provided on the high-side driver circuit 202a (e.g., via a bonding wire).

Similarly, as exemplified in FIG. 3, a set of tracks 306b may be configured to route signals between the input and/or output leads 204b and the low-side driver circuit 202b. In particular, each of the tracks 306b may comprise a first end bonded to a respective lead 204b (e.g., via a bonding wire), and a second end bonded to a respective bonding pad provided on the low-side driver circuit 202b (e.g., via a bonding wire).

Therefore, one or more embodiments may facilitate providing electrical connection between the input and/or output pads of the semiconductor device and the semiconductor dies encapsulated therein, insofar as direct wire bonding between the leads and the semiconductor dies may be replaced by routing via patterned tracks on the electrically insulating substrate(s) 300, which may turn out to provide increased design flexibility and reduced parasitic inductance.

In one or more embodiments, the electrically insulating substrate(s) 300 may have a layer of electrically-conductive material (e.g., copper) provided on a second surface thereof (e.g., a lower or bottom surface) opposite the first surface. For instance, the layer of electrically-conductive material provided at the second surface may comprise a single (large) pad or a plurality of pads configured for soldering the packaged semiconductor device onto a printed circuit board. In one or more embodiments, the thickness of such layer of electrically-conductive material may be in the range of 10 μm to 500 μm.

In one or more embodiments, patterned layer(s) of electrically-conductive material may be provided on a first (e.g., upper) and/or a second (e.g., lower) surface of the electrically insulating substrate(s) 300 by resorting to a technology such as Direct Bonded Copper (DBC) or Direct Plated Copper (DPC).

Therefore, one or more embodiments may provide an insulation substrate in a flat no-leads (e.g., QFN) package providing electrical insulation between the semiconductor dies and the external die pads. The insulation substrate may be fully embedded in the molding compound, and the package may encapsulate various high voltage dies and drivers. The exposed pad(s) may thus be electrically insulated, so that the creepage/clearance rules may be applied to the high voltage pins only, e.g., the pins 200a, 200c providing connection to the high voltage supply (e.g., a high voltage battery for use in an electric vehicle).

It will be understood that reference to the particular multi-chip arrangement illustrated in FIGS. 2 and 3 is made purely by way of non-limiting example, and that the present invention may be applied to any type of multi-chip semiconductor device where electrical insulation of exposed die pads may be beneficial.

It will be similarly understood that, in one or more embodiments, not all the exposed die pads may be electrically insulated. For instance, one or more embodiments may comprise both electrically insulated exposed die pads and electrically conductive exposed die pads. For instance, the electrically conductive exposed die pads may be provided by resorting to a conventional QFN leadframe arrangement.

One or more embodiments may relate to one or more methods of manufacturing semiconductor devices as disclosed herein.

For instance, FIGS. 4A to 4E are exemplary of possible manufacturing steps of a method according to one or more embodiments.

As exemplified in FIG. 4A, a step of the method may comprise providing a leadframe LF. The leadframe LF may comprise a plurality of semiconductor device locations 40. Each of the semiconductor device locations 40 may be surrounded by a respective set of leads of the leadframe, e.g., arranged at the four sides of a square or rectangular area as conventional in the manufacture of flat no-leads semiconductor devices. In contrast with conventional leadframes for the manufacture of flat no-leads semiconductor devices, a leadframe LF as exemplified in FIG. 4A may not comprise metallic die pads at the semiconductor device locations 40.

The leadframe LF may be designed to comprise an array of rows and columns according to the package size and strip outer dimensions.

As exemplified in FIG. 4B, another step of the method may comprise providing (e.g., attaching) an adhesive tape A adhering at a first (e.g., bottom or rear) side of the leadframe LF. The adhesive tape A may act as a temporary support substrate which facilitates the placement of the semiconductor devices at the semiconductor device locations 40, as disclosed in the following.

As exemplified in FIG. 4C, another step of the method may comprise providing an insulating substrate S having an electrically-conductive (e.g., metallic) layer thereon. The electrically-conductive layer may be patterned or shaped to provide electrically-conductive pads and interconnects according to a desired pattern. For instance, the insulating substrate S may be a ceramic substrate having pads and interconnects patterned by direct bonding copper (DBC), e.g., a "DBC master card". Purely by way of example, the insulating substrate S may have dimensions equal to 138× 190 mm. Therefore, the insulating substrate S may be configured to accommodate semiconductor dies to provide an array of semiconductor devices.

As exemplified in FIG. 4C, the method may comprise attaching (in a manner known per se) semiconductor dies (e.g., high voltage components such as high voltage transistors, diodes and driver circuits) at the electrically-conductive pads.

As exemplified in FIG. 4D, another step of the method may comprise singulating the semiconductor devices from the insulating substrate S. After singulation, a plurality of individual insulating substrates 300 may be provided, with each insulating substrate 300 having at least one electrically-conductive die pad 400 and electrically-conductive tracks 402 patterned thereon, and at least one semiconductor die 404 attached at the at least one die pad 400. Singulated devices 42 as illustrated in FIG. 4D may also be referred to as "bare semiconductor devices" in the present description.

As exemplified in FIG. 4E, another step of the method may comprise attaching singulated semiconductor devices 42 on the adhesive tape A at the semiconductor device locations 40. In such a step, the adhesive tape A may thus support the leadframe LF and the insulating substrates 300 having semiconductor devices attached thereon.

The method may further comprise bonding the semiconductor devices to the electrically-conductive pads/tracks provided on the insulating substrate S and/or to the respective leads of the leadframe LF (e.g., via wire bonding), molding (e.g., filling) a molding compound (e.g., an epoxy resin) to encapsulate the semiconductor devices and the leadframe, and singulating the semiconductor devices by cutting the leadframe to provide packaged semiconductor devices. The supporting adhesive tape A may be removed after the encapsulation step.

As previously discussed, in one or more embodiments of to the present description the insulating substrate 300 may be provided on an otherwise conventional metallic die pad of a leadframe, i.e., the insulating substrate 300 may not replace the metallic die pad of the leadframe but may be provided in addition to the metallic die pad of the leadframe.

Therefore, one or more embodiments may relate to a method of manufacturing semiconductor devices which relies on the use of a conventional flat no-leads leadframe, comprising an array of metallic die pads surrounded by respective arrays of leads. The method may distinguish from conventional methods of manufacturing flat no-leads packaged semiconductor device in that it comprises attaching, at said metallic die pads, respective insulating substrates 300 having the semiconductor die(s) attached thereon.

One or more embodiments may thus provide one or more of the following advantages:

reducing the length of the electrical connections between the gate driver circuit(s) 202a, 202b and the respective power transistors HST, LST by facilitating a closer positioning of the dies in the package (e.g., with a reduction in length of up to 5 times), thereby reducing the parasitic inductance(s) and/or the cross-talk between connections;

providing electrical insulation between the high-side components and the low-side components inside the package by means of the interposed molding compound MC (e.g., with an insulation distance of 0.5 mm compared to a 4 mm creepage distance);

dispensing with design constraints of the PCB relating to the thermal resistance between the semiconductor dies and the ambient;

providing improved thermal performance (e.g., lower thermal resistance between the semiconductor dies and the ambient due to the absence of individual pads and a high number of thermal vias in the PCB); and avoiding modifications of the package outline (e.g., giving the possibility of retaining compliance with Jedec standardization).

As exemplified herein, a semiconductor device (e.g., 30) may comprise: a substrate (e.g., 300) having a first surface and a second surface opposite the first surface; at least one semiconductor die (e.g., HST, LST, HSD, LSD, 202a, 202b) mounted at said first surface of the substrate at at least one respective semiconductor die mounting location; a plurality of electrically-conductive leads (e.g., 200a, 200b, 200c, 204a, 204b) arranged around said substrate; a plurality of electrically-conductive formations (e.g., 304a, 304b, 306a, 306b) coupling the at least one semiconductor die to selected leads in said plurality of electrically-conductive leads; and package molding material (e.g., MC) molded onto the at least one semiconductor die mounted at said first surface of the substrate, onto the plurality of electrically-conductive leads and onto the plurality of electrically-conductive formations leaving the second surface of said substrate uncovered by (e.g., exposed outside of) said package molding material.

As exemplified herein, said substrate may comprise a layer of electrically-insulating material.

As exemplified herein, said plurality of electrically-conductive formations may comprise a first electrically-conductive pattern (e.g., a patterned metallic layer, optionally comprising a copper layer) on said first surface of the substrate. The first electrically-conductive pattern may comprise: at least one die pad at said at least one semiconductor die mounting location; and/or electrically-conductive lines coupling the at least one semiconductor die to selected leads in said plurality of electrically-conductive leads.

As exemplified herein, a device may comprise a plurality of semiconductor dice mounted at said first surface of the substrate at a respective plurality of semiconductor die mounting locations, and the electrically-conductive pattern may comprise electrically-conductive lines coupling at least one semiconductor die in said plurality of semiconductor dice to at least another semiconductor die in said plurality of semiconductor dice.

As exemplified herein, said plurality of semiconductor dice may comprise a first transistor die (e.g., HST), a second transistor die (e.g., LST), a first diode die (e.g., HSD), a second diode die (e.g., LSD), a first transistor driving circuit die (e.g., 202a) and a second transistor driving circuit die (e.g., 202b). The plurality of electrically-conductive leads arranged around said substrate may comprise a first set of control signal leads (e.g., 204a), a second set of control signal leads (e.g., 204b), a positive voltage supply lead (e.g., 200a), a negative or reference voltage supply lead (e.g., 200c) and an output voltage lead (e.g., 200b). The electrically-conductive lines in said electrically-conductive pattern on said first surface of the substrate may comprise a first electrically-conductive line (e.g., 302a) coupling a drain or collector terminal of the first transistor die to a cathode terminal of the first diode die, a second electrically-conductive line (e.g., 302b) coupling a drain or collector terminal of the second transistor die to a cathode terminal of the second diode die, a first subset of electrically-conductive lines (e.g., 306a) configured to route signals from a periphery of the substrate towards the first transistor driving circuit die, and a second subset of electrically-conductive lines (e.g., 306b) configured to route signals from the periphery of the substrate towards the second transistor driving circuit die. The plurality of electrically-conductive formations may further comprise bonding wires coupling selected leads in said plurality of electrically-conductive leads to said electrically-conductive lines.

As exemplified herein, said layer of electrically-insulating material may comprise a ceramic material, optionally an oxide material and/or a nitride material, optionally aluminum oxide and/or silicon nitride.

As exemplified herein, a thickness of said layer of electrically-insulating material may be in the range of 100 μm to 1.27 mm, optionally equal to 0.25 mm.

As exemplified herein, said substrate may comprise a layer of electrically-conductive material (e.g., a metallic material, optionally copper) exposed to the outer surface of said package molding material (e.g., configured to provide a soldering pad for soldering the semiconductor device to a printed circuit board).

As exemplified herein, said layer of electrically-conductive material exposed to the outer surface of said package molding material may comprise a second electrically-conductive pattern (e.g., a metallic layer, optionally comprising a copper layer) onto said second surface of the substrate. By way of example, a thickness of the second electrically-conductive pattern may be in the range of few microns (e.g., 10 μm) up to thick copper (e.g., 500 μm).

As exemplified herein, said layer of electrically-conductive material exposed to the outer surface of said package molding material may comprise a die pad of a leadframe provided in the device.

As exemplified herein, a device may comprise a flat no-leads package, optionally a quad-flat no-leads package.

As exemplified herein, said at least one semiconductor die may comprise at least one high-voltage semiconductor die, and said substrate may comprise a layer of electrically-insulating material configured to provide high-voltage insulation of said at least one high-voltage semiconductor die.

As exemplified herein, a method of manufacturing packaged semiconductor devices may comprise: providing at least one bare semiconductor device (e.g., 42), wherein the at least one bare semiconductor device includes: a substrate comprising a layer of electrically-insulating material, the substrate having a first surface and a second surface opposite the first surface, electrically-conductive formations formed at said first surface of the substrate, and at least one semiconductor die mounted at said first surface of the substrate; providing a leadframe (e.g., LF) comprising at least one set of electrically-conductive leads arranged around at least one respective semiconductor device location (e.g., 40); positioning said at least one bare semiconductor device at said at least one respective semiconductor device location within said leadframe; electrically coupling (e.g., wire bonding) said at least one semiconductor die to said electrically-conductive formations and/or to said at least one respective set of electrically-conductive leads; and molding package molding material onto said at least one bare semiconductor device leaving said second surface of said substrate uncovered by (e.g., exposed outside of) said package molding material.

As exemplified herein, positioning said at least one bare semiconductor device at said at least one respective semiconductor device location may comprise attaching an adhesive tape (e.g., A) at a side of said leadframe, and attaching said at least one bare semiconductor device on said adhesive tape at said at least one respective semiconductor device location within said leadframe.

As exemplified herein, said leadframe may comprise at least one die pad arranged at said at least one respective semiconductor device location, and positioning said at least one bare semiconductor device at said at least one respective semiconductor device location may comprise mounting said at least one bare semiconductor device on said at least one die pad of the leadframe.

Without prejudice to the underlying principles, the details and embodiments may vary, even significantly, with respect to what has been described by way of example only, without departing from the extent of protection.

The claims are an integral part of the technical teaching provided herein in respect of the embodiments.

The extent of protection is determined by the annexed claims.

The invention claimed is:

1. A device, comprising:
an electrically-insulating substrate having a first surface and a second surface opposite the first surface, wherein each of the first and second surfaces occupies a first square or rectangular area;
at least one semiconductor die mounted at said first surface of the electrically-insulating said at least one respective semiconductor die mounting location;
a plurality of electrically-conductive leads of a leadframe arranged around an opening defined by a second square or rectangular area that is larger than the first square or rectangular area, wherein said electrically-insulating substrate is positioned within the opening defined by the second square or rectangular area;
a plurality of electrically-conductive formations coupling the at least one semiconductor die to selected leads in said plurality of electrically-conductive leads; and
package molding material molded onto the at least one semiconductor die mounted at said first surface of the electrically-insulating substrate, onto the plurality of electrically-conductive leads of the leadframe and onto the plurality of electrically-conductive formations to form a flat, no-leads package leaving the second surface of said electrically-insulating substrate uncovered by said package molding material and leaving bottom surfaces of the plurality of electrically-conductive leads uncovered by said package molding material;
wherein said plurality of electrically-conductive formations comprises a first electrically-conductive pattern on said first surface of the electrically-insulating substrate;
a plurality of semiconductor dice mounted at said first surface of the electrically-insulating substrate at a respective plurality of semiconductor die mounting locations, wherein the first electrically-conductive pattern comprises electrically-conductive lines coupling at least one semiconductor die in said plurality of semiconductor dice to at least another semiconductor die in said plurality of semiconductor dice;
wherein:
said plurality of semiconductor dice comprises a first transistor die, a second transistor die, a first diode die, a second diode die, a first transistor driving circuit die and a second transistor driving circuit die;
said plurality of electrically-conductive leads arranged around said substrate comprises a first set of control signal leads, a second set of control signal leads, a positive voltage supply lead, a negative or reference voltage supply lead and an output voltage lead;
said electrically-conductive lines in said electrically-conductive pattern on said first surface of the electrically-insulating substrate comprise:
a first electrically-conductive line coupling a drain or collector terminal of the first transistor die to a cathode terminal of the first diode die;
a second electrically-conductive line coupling a drain or collector terminal of the second transistor die to a cathode terminal of the second diode die;
a first subset of electrically-conductive lines configured to route signals from a periphery of the electrically-insulating substrate towards the first transistor driving circuit die; and
a second subset of electrically-conductive lines configured to route signals from the periphery of the electrically-insulating substrate towards the second transistor driving circuit die; and
wherein said plurality of electrically-conductive formations further comprises bonding wires coupling selected leads in said plurality of electrically-conductive leads to said electrically-conductive lines.

2. The device of claim 1, wherein the first electrically-conductive pattern comprises at least one die pad at said at least one semiconductor die mounting location.

3. The device of claim 1, wherein the first electrically-conductive pattern comprises electrically-conductive lines coupling the at least one semiconductor die to selected leads in said plurality of electrically-conductive leads.

4. The device of claim 1, wherein said electrically-insulating substrate comprises a ceramic substrate.

5. The device of claim 1, wherein said electrically-insulating substrate comprises one or more layers of an oxide material and a nitride material.

6. The device of claim 1, wherein said electrically-insulating substrate comprises one or more layers of an aluminum oxide material and a silicon nitride material.

7. The device of claim 1, further comprising a layer of electrically-conductive material on the second surface of said electrically-insulating substrate, wherein said layer of electrically-conductive material is uncovered by said package molding material.

8. The device of claim 7, wherein said layer of electrically-conductive material on the second surface of said electrically-insulating substrate comprises a die pad of said leadframe.

9. A device, comprising:
an electrically-insulating substrate having a first surface and a second surface opposite the first surface, wherein each of the first and second surfaces occupies a first square or rectangular area;
at least one semiconductor die mounted at said first surface of the electrically-insulating said at least one respective semiconductor die mounting location;
a plurality of electrically-conductive leads of a leadframe arranged around an opening defined by a second square or rectangular area that is larger than the first square or rectangular area, wherein said electrically-insulating substrate is positioned within the opening defined by the second square or rectangular area;
a plurality of electrically-conductive formations coupling the at least one semiconductor die to selected leads in said plurality of electrically-conductive leads;

package molding material molded onto the at least one semiconductor die mounted at said first surface of the electrically-insulating substrate, onto the plurality of electrically-conductive leads of the leadframe and onto the plurality of electrically-conductive formations to form a flat, no-leads package leaving the second surface of said electrically-insulating substrate uncovered by said package molding material and leaving bottom surfaces of the plurality of electrically-conductive leads uncovered by said package molding material; and a layer of electrically-conductive material on the second surface of said electrically-insulating substrate, wherein said layer of electrically-conductive material is uncovered by said package molding material;

wherein said layer of electrically-conductive material on the second surface of said electrically-insulating substrate comprises a die pad of said leadframe.

10. The device of claim 9, wherein a thickness of said electrically-insulating substrate is in a range of 100 μm to 1.27 mm.

11. The device of claim 9, wherein said layer of electrically-conductive material on the second surface of said electrically-insulating substrate comprises a second electrically-conductive pattern onto said second surface of the substrate.

12. The device of claim 11, wherein a thickness of said second electrically-conductive pattern is in a range of 10 μm to 500 μm.

13. The device of claim 9, wherein said at least one semiconductor die comprises at least one high-voltage semiconductor die and wherein said layer of electrically-insulating material provides high-voltage insulation of said at least one high-voltage semiconductor die.

14. The device of claim 9, wherein first surface of the electrically-insulating substrate includes a the first electrically-conductive pattern comprising electrically-conductive lines coupling the at least one semiconductor die to selected leads in said plurality of electrically-conductive leads.

15. The device of claim 9, wherein said electrically-insulating substrate comprises a ceramic substrate.

16. The device of claim 9, wherein said electrically-insulating substrate comprises one or more layers of an oxide material and a nitride material.

17. The device of claim 9, wherein said electrically-insulating substrate comprises one or more layers of an aluminum oxide material and a silicon nitride material.

18. A method of manufacturing packaged semiconductor devices, comprising:

providing at least one bare semiconductor device which includes: an electrically-insulating substrate, wherein the electrically-insulating substrate has a first surface and a second surface opposite the first surface; electrically-conductive formations formed at said first surface of the electrically-insulating substrate; and at least one semiconductor die mounted at said first surface of the electrically-insulating substrate;

providing a leadframe comprising at least one set of electrically-conductive leads arranged around at least one respective semiconductor device location;

positioning said at least one bare semiconductor device at said at least one respective semiconductor device location within said leadframe;

electrically coupling said at least one semiconductor die to said electrically-conductive formations and to said at least one respective set of electrically-conductive leads; and molding package molding material onto said at least one bare semiconductor device to form a flat, no-leads package leaving the second surface of said electrically-insulating substrate uncovered by said package molding material and leaving bottom surfaces of the plurality of electrically-conductive leads uncovered by said package molding material;

wherein said leadframe comprises at least one die pad arranged at said at least one respective semiconductor device location, and wherein positioning said at least one bare semiconductor device at said at least one respective semiconductor device location comprises mounting said at least one bare semiconductor device on said at least one die pad of the leadframe.

* * * * *